(12) United States Patent
Sun et al.

(10) Patent No.: US 10,714,560 B2
(45) Date of Patent: Jul. 14, 2020

(54) FLEXIBLE DISPLAY PANEL INCLUDING FINGERPRINT RECOGNITION AREA AND MANUFACTURING METHOD THEREOF

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Kuo Sun, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

(*) Notice: Subject to any disclaimer, the term of this patent is extended or adjusted under 35 U.S.C. 154(b) by 0 days.

(21) Appl. No.: 15/993,956

(22) Filed: May 31, 2018

(65) Prior Publication Data

US 2019/0067408 A1 Feb. 28, 2019

(30) Foreign Application Priority Data

Aug. 31, 2017 (CN) .......................... 2017 1 0774930

(51) Int. Cl.
| | | |
|---|---|---|
| *H01L 51/00* | (2006.01) | |
| *G06K 9/00* | (2006.01) | |
| *H01L 27/32* | (2006.01) | |
| *H01L 51/52* | (2006.01) | |
| *G06K 9/20* | (2006.01) | |

(52) U.S. Cl.
CPC ........ *H01L 27/3276* (2013.01); *G06K 9/0002* (2013.01); *G06K 9/0004* (2013.01); *G06K 9/209* (2013.01); *H01L 27/3234* (2013.01); *H01L 51/0097* (2013.01); *H01L 51/5284* (2013.01); *H01L 2251/5338* (2013.01)

(58) Field of Classification Search
CPC ............. H01L 27/3276; H01L 27/3234; H01L 51/0097; H01L 51/5284; H01L 2251/5338; G06K 9/0002; G06K 9/0004
USPC ..... 257/72; 438/48, 128, 149, 151, 157, 283
See application file for complete search history.

(56) References Cited

U.S. PATENT DOCUMENTS

| | | | | |
|---|---|---|---|---|
| 2006/0209233 A1* | 9/2006 | Kawashima | ...... | G02F 1/133512 349/106 |
| 2010/0165255 A1* | 7/2010 | Ishitani | ............. | G02F 1/133603 349/69 |

(Continued)

*Primary Examiner* — Didarul A Mazumder
(74) *Attorney, Agent, or Firm* — Nath, Goldberg & Meyer; Joshua B. Goldberg

(57) ABSTRACT

The present disclosure provides a flexible display panel and a manufacturing method thereof. The flexible display panel comprises a flexible substrate, an inorganic layer and a planarization layer. The flexible substrate includes a display area and a peripheral area, the display area has a fingerprint recognition area, and the peripheral area has a bending area. The inorganic layer is provided on one surface of the flexible substrate, a first black planarization layer for filtering light is provided on or in the inorganic layer at the fingerprint recognition area, and a second black planarization layer is provided on or in the organic layer at the bending area. The planarization layer is provided on the first and second black planarization layers and the inorganic layer away from the flexible substrate.

11 Claims, 6 Drawing Sheets

(56) References Cited

U.S. PATENT DOCUMENTS

| | | | |
|---|---|---|---|
| 2011/0057908 A1* | 3/2011 | Park | G06F 3/0412 345/176 |
| 2012/0306777 A1* | 12/2012 | Kang | G06F 3/044 345/173 |
| 2015/0125050 A1* | 5/2015 | Lee | G06K 9/0002 382/124 |
| 2016/0179229 A1* | 6/2016 | Ahn | G06F 3/041 345/173 |
| 2016/0202782 A1* | 7/2016 | Park | G06F 3/044 345/173 |
| 2017/0262022 A1* | 9/2017 | Choi | G02B 5/3025 |
| 2017/0278900 A1* | 9/2017 | Yang | H01L 27/3272 |

* cited by examiner

FLEXIBLE DISPLAY PANEL INCLUDING FINGERPRINT RECOGNITION AREA AND MANUFACTURING METHOD THEREOF

CROSS REFERENCE TO RELATED APPLICATIONS

The present disclosure claims priority of the Chinese Patent Application with the Application No. 201710774930.6 filed Aug. 31, 2017, which is incorporated herein in the entire by reference.

TECHNICAL FIELD

The present disclosure relates to the field of display technology, particularly to a flexible display panel and a manufacturing method thereof.

BACKGROUND

With the development of display technology, a display device can present a better display effect, thus providing a user with a good visual experience. Due to the improvement of living standards, a user's demand for the display device is not limited to its display function only, but also requires other functions. For example, a fingerprint recognition function and a flexible display panel are widely used in a screen of a mobile phone, a personal digital assistant (PDA), a computer or any other electronic device.

SUMMARY

The disclosure provides a flexible splay panel and a manufacturing method thereof.

In some embodiments, the present disclosure provides a flexible display panel comprising a flexible substrate, an inorganic layer and a planarization layer, the flexible substrate has a display area and a peripheral area, the display area has a fingerprint recognition area, and the peripheral area has a bending area; the inorganic layer is provided on one surface of the flexible substrate, a first black planarization layer for filtering light is provided on or in the inorganic layer at the fingerprint recognition area, and a second black planarization layer is provided on or in the inorganic layer at the bending area; and the planarization layer is provided on the first and second black planarization layers and the inorganic layer away from the flexible substrate.

In some embodiments, the first black planarization layer and the second black planarization layer are made of an organic material.

In some embodiments, the organic material is photosensitive polyimide.

In some embodiments, the organic material is non-photosensitive polyimide.

In some embodiments, the first black planarization layer is provided with a plurality imaging holes arranged in array.

In some embodiments, a diameter of each of the plurality of imaging holes is in a range of about 6 μm to about 12 μm.

In some embodiments, a wiring component is provided on the second black planarization layer at the peripheral area.

In some embodiments, the inorganic layer comprises at least one of a barrier layer, a buffer layer, a gate insulation layer and an interlayer insulation layer.

In some embodiments, the flexible substrate is made of at least one of polyimide, polycarbonate, polyethylene, polyethylene terephthalate and polyacrylate.

In some embodiments, the flexible display panel further comprises a fingerprint acquisition element provided on the other surface of the flexible substrate opposite to the inorganic layer and the planarization layer at a position corresponding to the fingerprint recognition area, for acquiring a fingerprint image recognized by the first black planarization layer at the fingerprint recognition area.

In some embodiments, the second black planarization layer is made of a bulk organic material.

The present disclosure further provides a method for manufacturing a flexible display panel, comprising steps of:
preparing a flexible substrate;
forming an inorganic layer on the flexible substrate;
forming grooves in the inorganic layer at a finger recognition area in a display area and a bending area in a peripheral area by a first patterning process, respectively;
filling the grooves in the inorganic layer at the finger recognition area and the bending area with a black organic material to form a first black planarization material layer and a second black planarization layer; and
forming a first black planarization layer in the first black planarization material layer by a second patterning process such that the first black planarization layer is provided with a plurality of imaging holes arranged in an array.

In some embodiments, the step of forming grooves in the inorganic layer at a finger recognition area in a display area and a bending area in a peripheral area by a first patterning process respectively comprises:
forming a photoresist layer on the inorganic layer;
applying a mask plate on the photoresist layer and performing exposure and development on the photoresist layer; and
performing an etch process on the inorganic layer to form the grooves in the inorganic layer at the finger recognition area and the bending area.

In some embodiments, when the black organic material is a non-photosensitive organic material, the step of forming a first black planarization layer in the first black planarization material layer by a second patterning process such that the first black planarization layer is provided with a plurality of imaging holes arranged in an array comprises:
forming a photoresist layer on the first black planarization material layer;
applying a mask plate on the photoresist layer and performing exposure and development on the photoresist layer; and
performing an etch process on the first black planarization material layer to form the first black planarization layer which is provided with a plurality of imaging holes arranged in an array.

In some embodiments, when the black organic material is a photosensitive organic material, the step of forming a first black planarization layer in the first black planarization material layer by a second patterning process such that the first black planarization layer is provided with a plurality of imaging holes arranged in an array comprises:
applying a mask plate on the first black planarization material layer and performing exposure and development on the first black planarization material layer; and
performing an etch process on the first black planarization material layer to form the first black planarization layer which is provided with a plurality of imaging holes arranged in an array.

In some embodiments, the step of preparing the flexible substrate comprises coating an organic polymer material on a glass substrate.

In some embodiments, the non-photosensitive organic material is non-photosensitive polyimide.

In some embodiments, the photosensitive organic material is photosensitive polyimide.

The present disclosure further provides a method for manufacturing a flexible display panel, comprising steps of:

preparing a flexible substrate;

forming an inorganic layer on the flexible substrate;

forming a photosensitive black organic material layer on the inorganic layer; and applying a mask plate on the photosensitive black organic material and performing exposure, development and etching on the photosensitive black organic material to form a first black planarization layer at a fingerprint recognition area in a display area and a second black planarization layer at a bending area in a peripheral area on the inorganic layer such that the first black planarization layer is provided with a plurality of imaging holes arranged in an array.

In some embodiments, the photosensitive black organic materials photosensitive polyimide.

BRIEF DESCRIPTION OF DRAWINGS

The accompanying drawings, which form a part of the description, are used to provide further understanding of this disclosure, and to interpret this disclosure along with the following detail description of embodiments, but not to limit this disclosure. In the accompanying drawings.

REFERENCE NUMERALS

Figure 1:
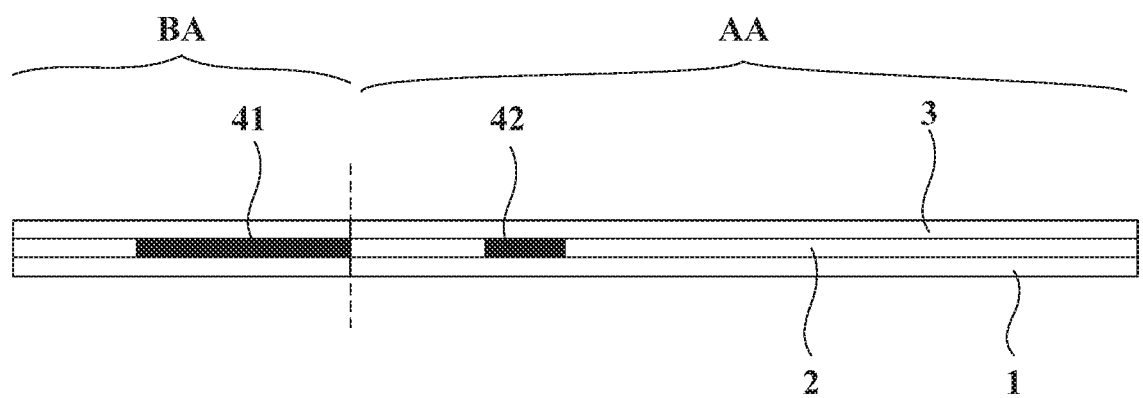
FIG. 1 is a cross-sectional view of a structure of a flexible display panel provided by an embodiment of the present disclosure.

1—flexible substrate; 2—inorganic layer; 3—planarization layer; 41—second black planarization layer; 42—first black planarization layer; 421—imaging hole; 5—wiring component; AA—display area; AA1—fingerprint recognition area; BA—peripheral area; BA1—bending area; 49—image acquisition element.

DETAILED DESCRIPTION OF THE EMBODIMENTS

Next, embodiments of the present disclosure will be described in detail in conjunction with the accompanying drawings, in which same or similar elements or elements having same or similar functions are denoted by same or similar reference numerals throughout. The following embodiments described with reference to the drawings are exemplary, and are only for interpreting the disclosure, but not for limiting the present disclosure.

At present, capacitive fingerprint recognition technology and photosensitive fingerprint scanning technology are generally used for fingerprint recognition. The capacitive fingerprint recognition technology uses a capacitance value of a capacitor formed between a crista or a valley of a finger and a sensing electrode to detect a position of the crista or the valley of the finger so as to generate fingerprint image information. Photosensitive fingerprint scanning technology collects information regarding light reflected by a surface of the finger through a photosensitive element to obtain entire fingerprint image information by splicing. The existing capacitive fingerprint recognition technology requires additional hardware devices such as a touch switch, a capacitive component, a fingerprint recognition sensor, and the like to be provided at the fingerprint touch position, which increases manufacturing time and design cost. Moreover, such fingerprint recognition technology cannot be implemented in a display area.

In order to reduce the size of a lower frame of an existing flexible display panel, the flexible display panel may be bent at the lower frame, and an inorganic layer of the flexible display panel is easily broken when the flexible display panel is bent.

Figure 2:
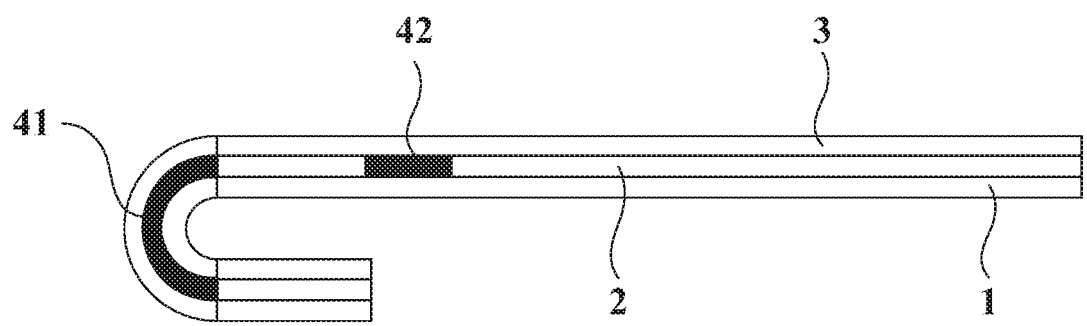
FIG. 2 is a cross-sectional view of a structure of a flexible display panel in a bending state provided by an embodiment of the present disclosure.
Figure 3:
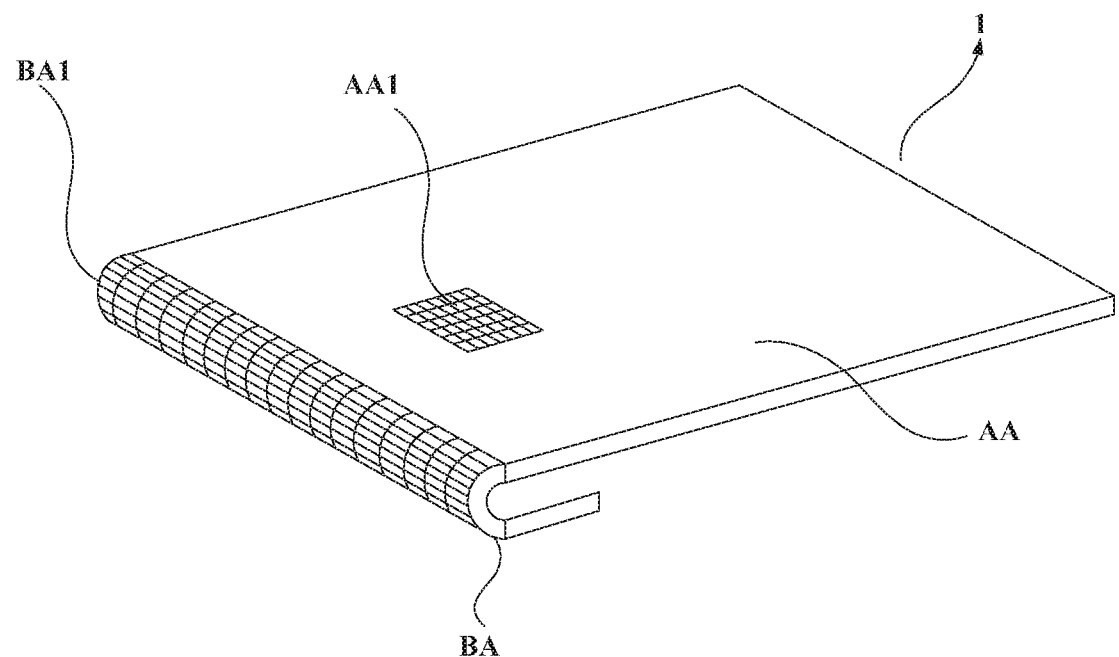
FIG. 3 is a schematic view of a structure of a flexible substrate of a flexible display panel provided by an embodiment of the present disclosure.

Referring to FIGS. 1, 2 and 3, a flexible display panel provided by an embodiment of the present disclosure includes a flexible substrate 1, an inorganic layer 2, and a planarization layer 3; the flexible substrate 1 includes a display area AA and a peripheral area BA, the display area AA has a fingerprint recognition area AA1, the peripheral area BA has a bending area BA1; the inorganic layer 2 is provided on one surface of the flexible substrate 1, a first black planarization layer 42 for filtering light is provided in the inorganic layer 2 at the fingerprint recognition area AA1, and a second black planarization layer 41 is provided in the inorganic layer 2 at the bending area BA1; and the planarization layer 3 is provided on the first and second black planarization layers 42, 41 and the inorganic layer 2 away from (or distal to) the flexible substrate 1.

In some embodiments, the first black planarization layer 42 and the second black planarization layer 41 may be made of a same organic material or different organic materials. For example, the first black planarization layer 42 and the second black planarization layer 41 are made of a photosensitive or a non-photosensitive polyimide (P1) material.

In the present disclosure, the inorganic layer of the flexible display panel is provided with the first black planarization layer at the fingerprint recognition area in the display area and the second black planarization layer at the bend region in the peripheral area. For example, grooves in the inorganic layer 2 are filled with an organic black planarization material to form the first black planarization layer and the second black planarization layer, as shown in FIGS. 1-3.

The first and second black planarization layers in the grooves in the inorganic layer 3 at the fingerprint recognition area and the bend area may be formed by a single mask through a single patterning process and a same etching process, thus simplifying the manufacturing procedure and reducing a thickness of the display panel. Thus, the flexible display panel is provided with a fingerprint recognition function while the problem that the inorganic layer in the peripheral area is easy to be broken in the prior art is avoided and the damage resistance performance of the flexible display panel is improved. The present disclosure is not limited thereto, and the first black planarization layer 42 in the display area AA and the second black planarization layer 41 in the peripheral area BA may be formed by different patterning processes, respectively, as long as the first black planarization layer 42 and the second black planarization layer 41 are both made of an organic material or different organic materials to achieve the fingerprint recognition function and improved flexibility of the flexible display panel.

In some embodiment, as shown in FIGS. 1 and 2, the second black planarization layer 41 in the peripheral area BA may be made of a bulk organic material, which can save the process. However, the present disclosure is not limited thereto. Since the organic material is provided in the inorganic layer, compared with the prior art, flexibility of the flexible display panel is improved, and the flexible display panel is not easy to be broken.

Figure 4:
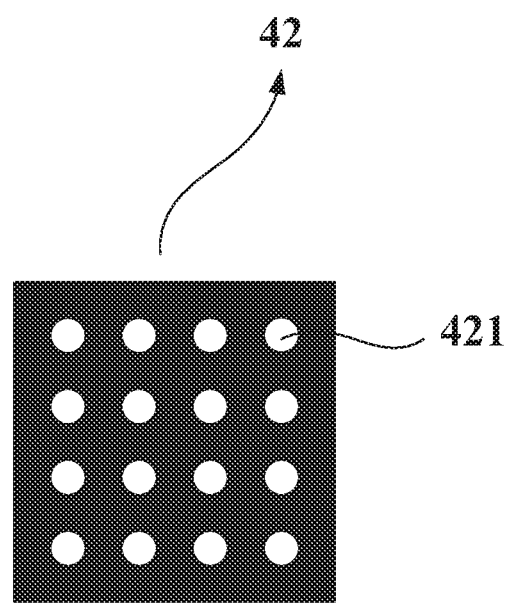
FIG. 4 is schematic view of a structure of a first black planarization layer of a flexible display panel provided by an embodiment of the present disclosure.

In some embodiments, as shown in FIG. 4, the first black planarization layer 42 for filtering light may be provided with a plurality of imaging holes 421 arranged in an array. That is, the flexible display panel may be configured based on a principle of pinhole imaging, so that a fingerprint image may be collected by the plurality of imaging holes arranged in the display panel. For example, a terminal device may be provided with the flexible display panel to perform operations of personal authentication such as screen unlocking, account verification and the like by fingerprint recognition.

A diameter of each of the plurality of imaging holes 421 is in a range of about 6 μm to about 12 m.

In the flexible display panel, the display area AA may include a plurality of pixels, and an image may be displayed through a combination of the plurality of pixels. Each pixel may include a pixel drive circuit and an organic light emitting diode (OLED). The pixel drive circuit may be of 2T1C structure including at least two thin film transistors and at least one storage capacitor to control light emission from the OLED.

Figure 5:
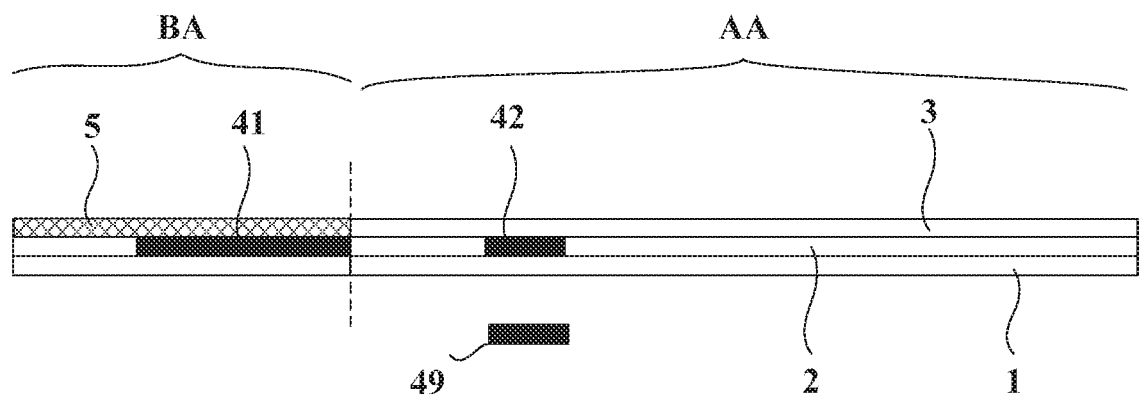
FIG. 5 is a cross-sectional view of a structure of a flexible display panel provided by an embodiment of the present disclosure.

In some embodiments, with reference to FIG. 5, a wiring component 5 may be further provided on the second black planarization layer 41 at the peripheral area BA of the flexible display panel. The wiring component 5 is connected to a plurality of lines, which will be electrically connected to a plurality of signal lines (such as a scan line, a data line, a drive voltage line) of each pixel in the display area AA, respectively. The wiring component 5 provides power and data signals for the flexible display panel.

In some embodiments, the inorganic layer of the flexible display panel may include at least one of a barrier layer, a buffer layer, a gate insulation layer, and an interlayer insulation layer. However, this disclosure is not limited thereto, and the inorganic layer may be selected according to actual production and application requirements, as long as it is possible to provide the inorganic layer in the display area AA with the fingerprint recognition area AA1 as described above, as well as provide the inorganic layer in the peripheral area BA with the bend area BA1 as described above.

In some embodiment, the flexible substrate may be made of at least one of polyimide, polycarbonate, polyethylene, polyethylene terephthalate and polyacrylate, as long as the flexible substrate is flexible and transparent. The present disclosure is not limited thereto, and the material thereof may be selected according to actual production and application requirements.

In addition, a material of the planarization layer is not limited in the present disclosure. The flexible display panel provided by the present disclosure may further include a fingerprint acquisition element 49 provided on the other surface of the flexible substrate 1 opposite to the inorganic layer 2 and the planarization layer 3 at a position corresponding to the fingerprint recognition area 42, for acquiring a fingerprint recognized by the first black planarization layer 42 at the fingerprint recognition area AA, as shown in FIG. 5. The fingerprint acquisition element 49 may be an independent device capable of collecting the fingerprint image, such as a conventional photoelectric conversion element. Of course, the fingerprint acquisition element 49 may also be any camera component as employed in the existing mobile phone and tablet computer.

When the fingerprint acquisition element acquires the fingerprint image, opening and closing of each pixel at the fingerprint recognition area in the flexible display panel are controlled to realize opening and closing of each imaging hole in the first black planarization layer for filtering light, thus controlling acquisition of the fingerprint image corresponding to the imaging hole. The opening and closing of each pixel can be controlled by making the pixel display different contents so that the pixel can be transparent or opaque. For example, a pixel displaying white (i.e., white color) may be set to be opening or be transparent, and a pixel displaying black (i.e., black color) may be set to be closing or be opaque. For example, at the time of T1, a first pixel C1 is opened, an imaging hole corresponding to the first pixel C1 is transparent to acquire the fingerprint image, and the other pixels in the fingerprint recognition area are closed to suspend the acquisition of the fingerprint image by the other imaging holes, and the fingerprint acquisition element obtains a fingerprint image ZW1 at the time of T2, a second pixel C2 is opened, an imaging hole corresponding to the second pixel C2 is transparent to acquire the fingerprint image, and the other pixels in the fingerprint recognition area are closed to suspend the acquisition of the fingerprint image by the other imaging holes, and the fingerprint acquisition element obtains a fingerprint image ZW2; and so on, the fingerprint images ZW1, ZW2, and ZW3 . . . Z16 are finally obtained in a case where the first black planarization layer 42 includes 16 imaging holes. Then, all the fingerprint images are tailored to get different regions corresponding to real fingerprint images, which are then spliced into an entire complete fingerprint image. Taking four imaging holes for acquiring four fingerprint images as an example, each of these four fingerprint images only contains a part of effective regions of the entire fingerprint image. These four images are tailored to obtain tailored effective regions, which are then spliced together to get the entire fingerprint image. It should be noted that, the foregoing description is made by taking the number of the imaging holes 421 being 16 or 4 as an example, however, the present disclosure is not limited thereto.

Figure 6:
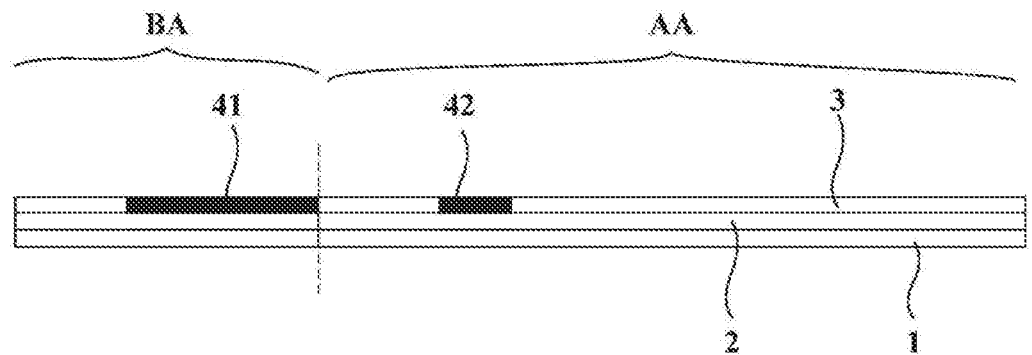
FIG. 6 is a cross-sectional view of a structure of a flexible display panel provided by an embodiment of the present disclosure.

In the above embodiments, the first black planarization layer 42 and the second black planarization layer 41 are provided in the inorganic layer 2. However, the present disclosure is not limited thereto, as shown in FIG. 6, the first black planarization layer 42 and the second black planarization layer 41 are provided on the inorganic layer 2. It should be noted that, FIG. 6 schematically illustrates that a top surface of the planarization layer 3 is flush with top surfaces of the first black planarization layer 42 and the second black planarization layer 41. However, the top surface of the planarization layer 3 may be higher than those of the first black planarization layer 42 and the second black planarization layer 41.

Figure 7:
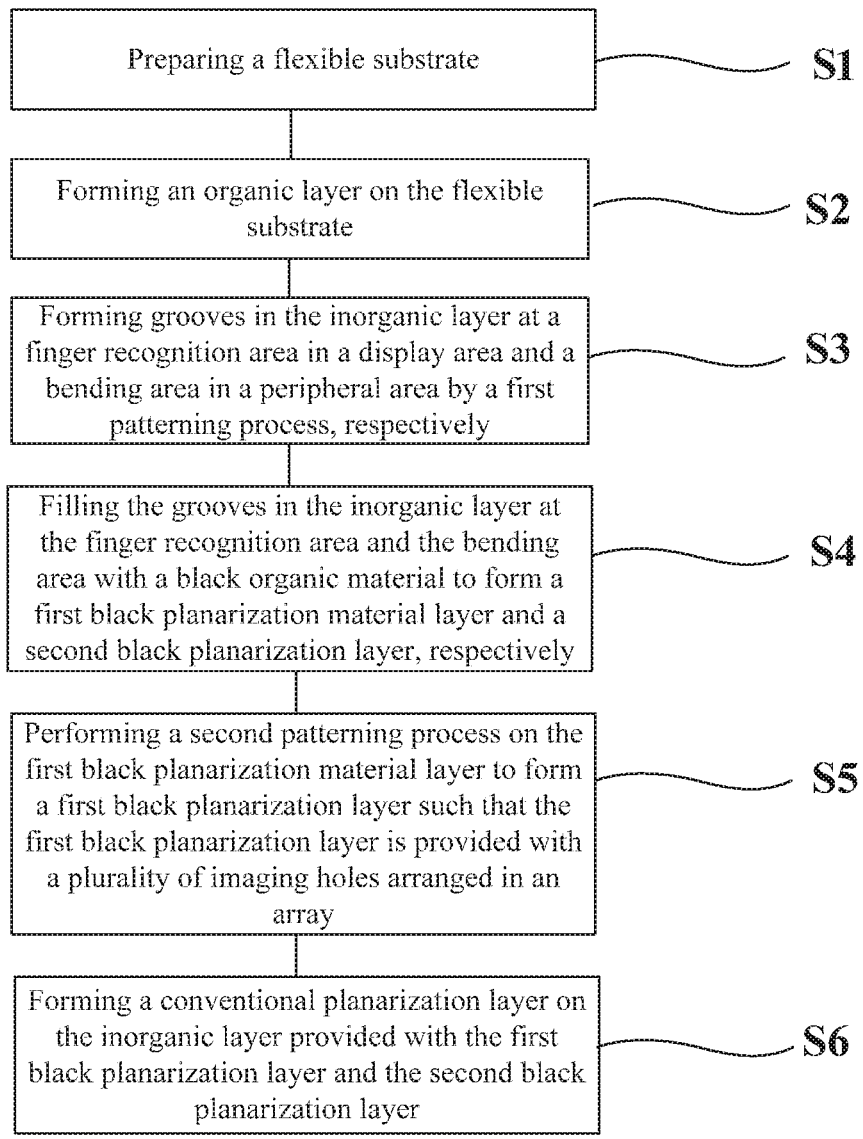
FIG. 7 is a flow chart illustrating a method for manufacturing a flexible display panel provided by an embodiment of the present disclosure.

In some embodiments, the present disclosure further provides a method for manufacturing a flexible display panel, as shown in FIG. 7, which includes steps S1 to S6.

At step S1, a flexible substrate is prepared. For example, the flexible substrate is formed by coating an organic polymer material on a glass substrate.

At step S2, an organic layer is formed on the flexible substrate.

At step S3, grooves are formed in the inorganic layer at a finger recognition area in a display area and a bending area in a peripheral area by a first patterning process, respectively.

At step S4, the grooves in the inorganic layer at the finger recognition area and the bending area are filled with a black organic material to form a first black planarization material layer and a second black planarization layer, respectively.

At step S5, a first black planarization layer is formed by performing a second patterning process on the first black planarization material layer such that the first black planarization layer is provided with a plurality of imaging holes arranged in an array.

At step S6, a conventional planarization layer is further formed on the inorganic layer provided with the first black planarization layer and the second black planarization layer.

In the above method for manufacturing a flexible display panel with fingerprint recognition function, the grooves at the fingerprint recognition area and at the bend area are formed by a same patterning process with a same mask, and then filled with the black planarization layer material to form the first black planarization material layer and the second black planarization layer, respectively, which simplifies the production process of the flexible display panel, improves the production efficiency of the flexible display panel, and reduces the thickness of the flexible display panel, so that the flexible display panel is provided with the fingerprint recognition function and its damage resistance performance is also improved.

Figure 8:
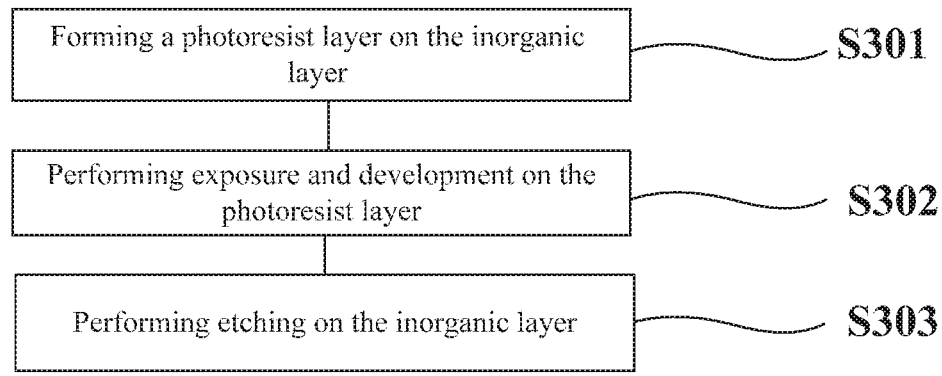
FIG. 8 is a flow chart illustrating steps of forming grooves at a fingerprint recognition area and a bend area in an embodiment of the present disclosure.
Figure 9:
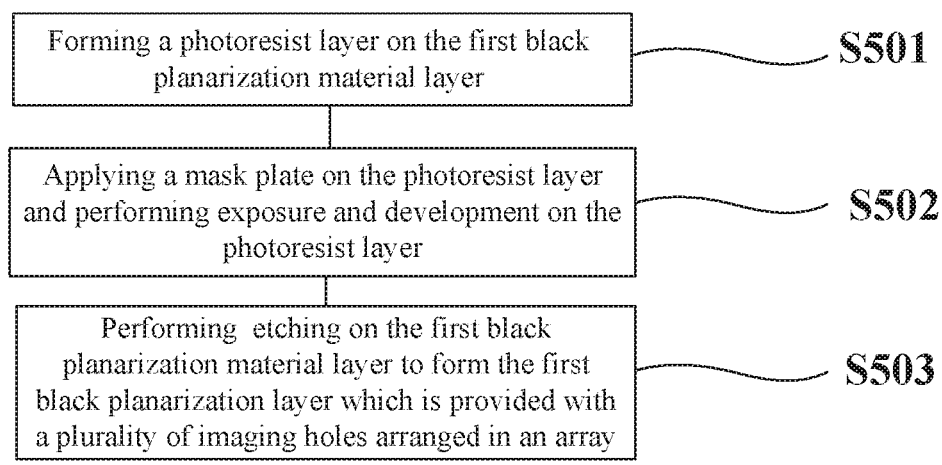
FIG. 9 is a flow chart illustrating steps of forming a first black planarization layer made of a non-photosensitive organic material in an embodiment of the present disclosure.
Figure 10:
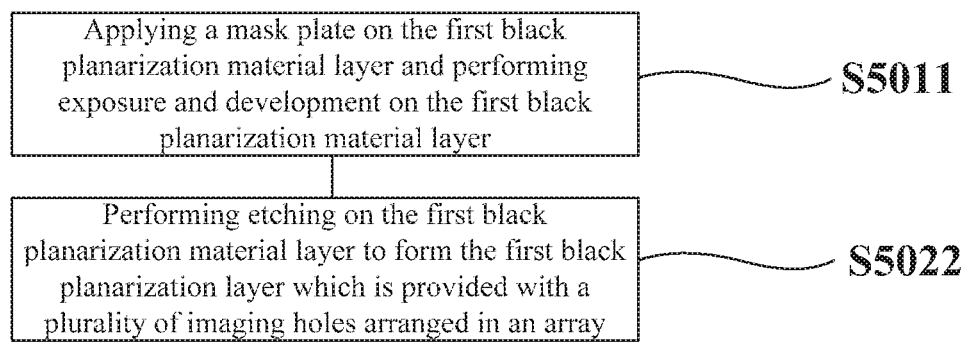
FIG. 10 is a flow chart illustrating steps of forming a first black planarization layer made of a photosensitive organic material in an embodiment of the present disclosure.

In some embodiments, as shown in FIG. 8, the above step S3 may include steps S301 to 303.

At step 301, a photoresist layer is formed on the inorganic layer.

At step 302, a mask plate is applied on the photoresist layer and exposure and development are performed on the photoresist layer.

At step 303, an etch process is performed on the inorganic layer to form the grooves in the inorganic layer at the finger recognition area and the bending area.

In the above method, when the first black planarization layer is made of a non-photosensitive organic material, the step S5 may include steps S501 to S503.

At step S501, a photoresist layer is formed on the first black planarization material layer.

At step S502, a mask plate is applied on the photoresist layer and exposure and development are performed on the photoresist layer.

At step S503, an etch process is performed on the first black planarization material layer to form the first black planarization layer which is provided with a plurality of imaging holes arranged in an array.

In some embodiment, the non-photosensitive organic material may be non-photosensitive polyimide.

Alternatively, in the above method, when the first black planarization layer is made of a photosensitive organic material, the step S5 may include steps S5011 and S5022.

At step S5011, a mask plate is applied on the first black planarization material layer and exposure and development are performed on the first black planarization material layer.

At step S5022, an etch process is performed on the first black planarization material layer to form the first black planarization layer which is provided with a plurality of imaging holes arranged in an array.

Figure 11:
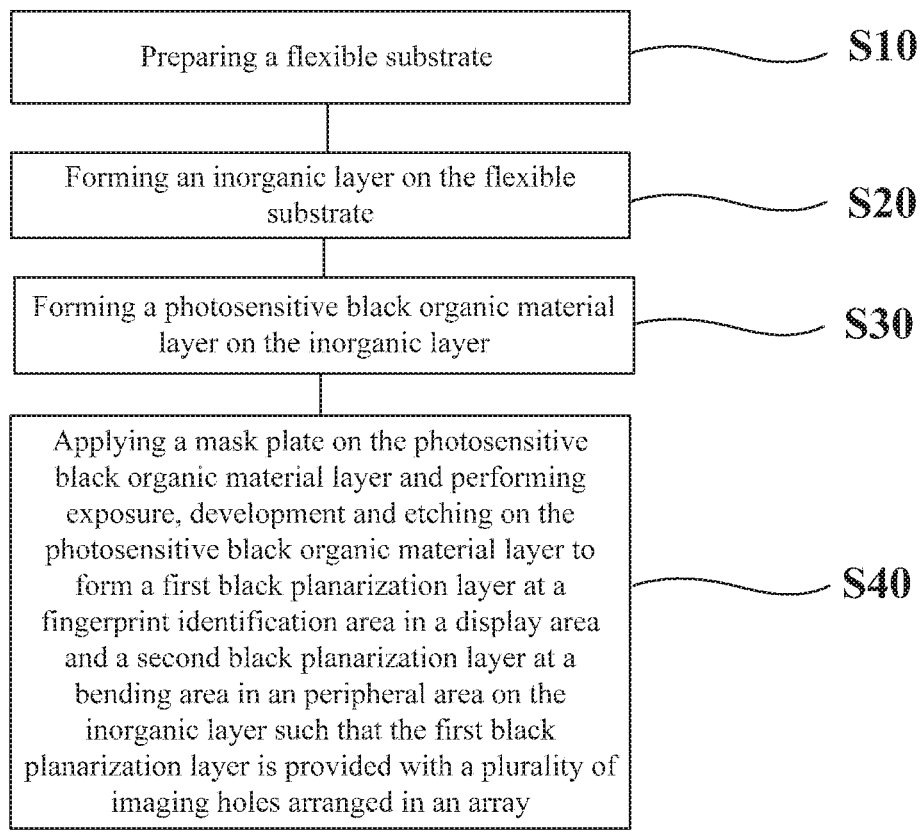
FIG. 11 is a flow chart illustrating a method for manufacturing a display panel provided by an embodiment of the present disclosure.

In some embodiments, the photosensitive organic material may be photosensitive polyimide In some embodiments, the present disclosure further provides a method for manufacturing a flexible display panel, which includes steps S10 to S40, as shown in FIG. 11.

At step S10, a flexible substrate is prepared.

At step S20, an inorganic layer is formed on the flexible substrate.

At step S30, a photosensitive black organic material layer is formed on the inorganic layer.

At step S40, a mask plate is applied on the photosensitive black organic material layer and exposure, development and etching are performed on the photosensitive black organic material layer to form a first black planarization layer at a fingerprint recognition area in a display area and a second black planarization layer at a bending area in a peripheral area on the inorganic layer such that the first black planarization layer is provided with a plurality of imaging holes arranged in an array.

In addition to the above steps S10 to S40, the method may optionally include the following step S50.

At step S50, a conventional planarization layer is further formed on the first black planarization layer and the second black planarization layer.

In some embodiment, the photosensitive black organic material may be photosensitive polyimide.

Obviously, those skilled in the art may make various modifications and variants to this disclosure without departing from spirit and scope of this disclosure. As such, if these modifications and variants of this disclosure fall into the scope of the claims and the equivalences of the claims, the present disclosure intends to include these modifications and variants.

The invention claimed is:

1. A flexible display panel, comprising a flexible substrate, an inorganic layer, and a planarization layer, wherein
    the flexible substrate has a display area and a peripheral area, the display area has a fingerprint recognition area, and the peripheral area has a bending area;
    the inorganic layer is provided on one surface of the flexible substrate, a first black planarization layer for filtering light is provided on or in the inorganic layer at the fingerprint recognition area, and a second black planarization layer is provided on or in the inorganic layer at the bending area; and
    the planarization layer is provided on a side of the inorganic layer provided with the first and second black planarization layers away from the flexible substrate.

2. The flexible display panel of claim 1, wherein the first black planarization layer and the second black planarization layer are made of an organic material.

3. The flexible display panel of claim 2, wherein the organic material is photosensitive polyimide.

4. The flexible display panel of claim 2, wherein the organic material is non-photosensitive polyimide.

5. The flexible display panel of claim 1, wherein the first black planarization layer is provided with a plurality of imaging holes arranged in an array.

6. The flexible display panel of claim 5, wherein a diameter of each of the plurality of imaging holes is in a range of 6 μm to 12 μm.

7. The flexible display panel of claim 1, wherein a wiring component is provided on the second black planarization layer at the peripheral area.

8. The flexible display panel of claim 1, wherein the inorganic layer comprises at least one of a barrier layer, a buffer layer, a gate insulation flyer and an interlayer insulation layer.

9. The flexible display panel of claim 1, wherein the flexible substrate is made of at least one of polyimide, polycarbonate, polyethylene, polyethylene terephthalate and polyacrylate.

10. The flexible display panel of claim 1, further comprising a fingerprint acquisition element provided on the other surface of the flexible substrate opposite to the inorganic layer and the planarization layer at a position corresponding to the fingerprint recognition area, for acquiring a fingerprint image recognized by the first black planarization layer at the fingerprint recognition area.

11. The flexible display panel of claim 1, wherein the second black planarization layer is made of a bulk organic material.

* * * * *